United States Patent
Kim et al.

(10) Patent No.: US 7,244,920 B2
(45) Date of Patent: Jul. 17, 2007

(54) CMOS SENSOR ARRAY WITH A SHARED STRUCTURE

(75) Inventors: Young-Chan Kim, Seongnam-si (KR); Yi-Tae Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/342,010

(22) Filed: Jan. 26, 2006

(65) Prior Publication Data
US 2006/0175536 A1  Aug. 10, 2006

(30) Foreign Application Priority Data
Feb. 7, 2005  (KR) ...................... 10-2005-0011131

(51) Int. Cl.
  *H01L 27/00*  (2006.01)
  *H01L 31/00*  (2006.01)
(52) U.S. Cl. .................................. 250/208.1; 348/308
(58) Field of Classification Search ............ 250/208.1; 257/292; 348/308
See application file for complete search history.

(56) References Cited

U.S. PATENT DOCUMENTS

2006/0138489 A1* 6/2006 Ahn et al. ................. 257/292
2006/0175538 A1* 8/2006 Kim et al. ............... 250/208.1
2006/0267052 A1* 11/2006 McKee ....................... 257/290

FOREIGN PATENT DOCUMENTS

| JP | 11-195776 | 7/1999 |
|---|---|---|
| JP | 2003-230055 | 8/2003 |
| KR | 10-2004-0033366 | 4/2004 |

* cited by examiner

*Primary Examiner*—John R. Lee
(74) *Attorney, Agent, or Firm*—F. Chau & Associates, LLC

(57) ABSTRACT

A CMOS sensor array includes a plurality of unit blocks. A unit block includes: N pairs of photo diode regions arranged in a first direction; 2N transfer transistors respectively corresponding to the photo diode regions, wherein each of the transfer transistors is formed at a corner of the corresponding photo diode region, and wherein for each pair of photo diode regions the two corresponding transfer transistors symmetrically oppose each other; N floating diffusion nodes, wherein each of the floating diffusion nodes is respectively arranged between a pair of photo diode regions, and wherein each of the floating diffusion nodes is shared by the two corresponding transfer transistors and the pair of photo diode regions; at least one metal line for coupling the floating diffusion nodes; a reset transistor for resetting a voltage of the floating diffusion nodes; a readout circuit including at least one transistor for sampling the floating diffusion node, wherein the reset transistor and the readout circuit are disposed between the pair of photo diode regions.

31 Claims, 8 Drawing Sheets

US 7,244,920 B2

CMOS SENSOR ARRAY WITH A SHARED STRUCTURE

CROSS-REFERENCE TO RELATED APPLICATIONS

This application claims priority to Korean Patent Application No. 10-2005-0011131, filed on Feb. 7, 2005, the contents of which are herein incorporated by reference in its entirety.

BACKGROUND OF THE INVENTION

1. Technical Field

The present invention relates to a layout of active pixel sensor arrays and, more particularly, to a layout of a complementary metal-oxide semiconductor (CMOS) active pixel sensor array having a shared structure in which a plurality of active pixel sensors share a reset transistor and readout transistors.

2. Description of the Related Art

An active pixel sensor is a device for transforming a photo image into an electrical signal. Active pixel sensors are widely used in digital cameras, camera-mounted mobile phones, visual systems, etc.

The active pixel sensor may be broadly classified into a charge-coupled device (CCD) active pixel sensor type and a complementary metal-oxide semiconductor (CMOS) active pixel sensor type. The CCD active pixel sensor type generally exhibits less noise and better image quality than the CMOS active pixel sensor type, but the production costs and power consumption are higher for the CCD type as compared to the CMOS type. The CMOS active pixel sensor type, which may be produced using conventional semiconductor manufacturing technology, may be provided at low costs, for example, due to ease of integration with peripheral systems for amplifying and processing signals.

Typical configurations of the CMOS active pixel sensor include 3-transistor and 4-transistor configurations. According to the 4-transistor configuration, one CMOS active pixel sensor includes one photo diode and four transistors. In the 4-transistor configuration, the integrated charge that is collected by the photo diode is transferred through the four transistors. In the 3-transistor configuration, one CMOS active pixel sensor includes one photo diode and three transistors, and the integrated charge that is collected by the photo diode is transferred through the three transistors.

FIG. 1 is a circuit diagram illustrating a conventional 4-transistor CMOS active pixel sensor. Referring to FIG. 1, the 4-transistor CMOS active pixel sensor 100 includes a photo diode PD, a transfer transistor M11, a reset transistor M12, a source follower transistor M13, and a select transistor M14.

When the reset transistor M12 is turned on according to a voltage rise of a gate RG, a voltage of a sensing node, i.e., a floating diffusion node FD is increased to a driving voltage VDD. At that point, the voltage of the floating diffusion node FD is sampled as a reference voltage by means of the source follower transistor M13 and the select transistor M14.

During an integration period, electron-hole pairs are generated in proportion to the light that is incident on the photo diode PD. After integration, the collected charge is transferred to the floating diffusion node FD according to a voltage rise of a gate TG of the transfer transistor M11. When the voltage of the floating diffusion node FD is decreased in proportion to the transferred charge, a source voltage of the source follower transistor M13 is changed.

Finally, when the select transistor M14 is turned on according to a rise of a gate SEL of the select transistor M14, the source voltage of the source follower transistor M13 is output as an output signal Vout. An accepted light is sensed by a voltage difference between the reference voltage and the output signal Vout, and this process is referred to as a correlated double sampling. Correlated double sampling yields a representation of the true charge associated with each pixel.

FIG. 2 is a circuit diagram illustrating a conventional 3-transistor CMOS active pixel sensor. Referring to FIG. 2, the 3-transistor CMOS active pixel sensor 200 includes a photo diode PD, a transfer transistor M21, a reset transistor M22 and a source follower transistor M23.

In the CMOS active pixel sensor 200 of FIG. 2, a dynamic driving voltage DVD is used instead of excluding the select transistor M14 from the CMOS active pixel sensor 100 of FIG. 1. The dynamic driving voltage DVD is increased to a high level when the floating diffusion node FD is reset and when a voltage of the floating diffusion node FD is sensed, but is generally maintained at a low level. Therefore, the select transistor M14 may be substituted using the dynamic driving voltage DVD.

When the dynamic driving voltage DVD reaches the high level and a gate RG voltage of the reset transistor M22 is increased to turn on the reset transistor M22, a voltage of the floating diffusion node FD is increased. At that point, the voltage of the floating diffusion node FD is sampled as a reference voltage by means of the source follower transistor M23 to be outputted to an internal circuit (not shown) for processing output signals of the active pixel sensors. After the reference voltage is output, the dynamic driving voltage is decreased to the low level.

Integration and charge transfer functions take place within the CMOS active pixel sensor as described above.

Recently, a shared structure, wherein a reset transistor, source follower transistor and select transistor may be shared, has been used for the purpose Of reducing a pixel size and enhancing a fill factor. The fill factor corresponds to a ratio of an area occupied by the photo diode with respect to an area occupied by peripheral circuits for resetting and outputting a sensed signal including a reset transistor, a source follower transistor and a select transistor. In general, the shared structure has been used for increasing the area of the photo diode by sharing transistors that perform the functions of amplifying and transferring signals.

FIG. 3 is a top plan view illustrating a conventional layout of a 4-transistor CMOS active pixel sensor array having a 4-pixel shared structure. The configuration of the 4-transistor CMOS active pixel sensor array of FIG. 3 is modified from the 4-transistor CMOS active pixel sensor of FIG. 1 so that a reset transistor, a source follower transistor and select transistor may be shared.

Referring to FIG. 3, the layout 300 of a 4-transistor CMOS active pixel sensor array includes a first photo diode region PD1, a second photo diode region PD2, a third photo diode region PD3 and a fourth photo diode region PD4. The layout 300 of a 4-transistor CMOS active pixel sensor array further includes four transfer transistors M31, M32, M33 and M34. The four photo diode regions and the four transfer transistors share a floating diffusion node FD, i.e., a drain region of the four transfer transistors forms a floating diffusion node FD.

A reset transistor M35, which resets a voltage of the floating diffusion node FD, is located between the third photo diode region PD3 and the fourth photo diode region PD4. A source follower transistor M36 and a select transistor M37 are located between the first photo diode region PD1 and the second photo diode region PD2. The source follower transistor M36 performs a sampling of the voltage of the floating diffusion node FD, and the select transistor M37 transfers a source voltage of the source follower transistor M36 to an internal circuit (not shown). The internal circuit (not shown) may be a circuit for processing output signals of the active pixel sensors.

In the layout of the shared structure, consideration may be given to maintaining an optical symmetry of the structure and enhancing the availability and productivity of a manufacturing process. In general, there are limitations to forming the layout of the active pixel sensor array having a shared structure. For example, in a configuration in which the floating diffusion node is shared, "steps" between the pixels along object edges may occur due to the layout itself or the manufacturing process.

SUMMARY OF THE INVENTION

Exemplary embodiments of the present invention provide a complementary metal-oxide semiconductor (CMOS) active pixel sensor array having a shared structure, a 4-transistor CMOS active pixel sensor array having a 4-pixel shared structure, and a 3-transistor CMOS active pixel sensor array having a 2-pixel shared structure.

In an exemplary embodiment of the present invention, a CMOS active pixel sensor array having a shared structure includes a plurality of unit blocks. The unit block includes: N pairs of photo diode regions arranged in a first direction on a plane, where N is a natural number; 2N transfer transistors respectively correspond to the photo diode regions, wherein each of the transfer transistors is formed at a corner of the corresponding photo diode region, and wherein for each pair of photo diode regions the two corresponding transfer transistors symmetrically oppose each other; N floating diffusion nodes, wherein each of the floating diffusion nodes is respectively arranged between a pair of photo diode regions, and wherein each of the floating diffusion nodes is shared by the two corresponding transfer transistors and the corresponding pair of photo diode regions; at least one metal line coupling the N floating diffusion nodes; a reset transistor configured to reset a voltage of the floating diffusion nodes; and a readout circuit including at least one transistor configured to sample the floating diffusion node, wherein the reset transistor and the at least one transistor of the readout are disposed between the pair of photo diode regions.

The transfer transistor regions may be formed in an oblique direction with respect to the first direction on the plane, and the oblique direction may be at about a 45-degree direction with respect to the first direction on the plane.

The CMOS active pixel sensor array may further include transfer transistor gate control lines that are extended at about a 90-degree direction with respect to the first direction on the plane. The CMOS active pixel sensor array may further include reset transistor gate control lines that are extended at about a 90-degree direction with respect to the first direction on the plane. The at least one metal line coupling the N floating diffusion nodes may be extended in the first direction. The readout circuit may include a source follower transistor in which a voltage of the floating diffusion node is applied to a gate of the source follower transistor.

The readout circuit further may include a select transistor configured to output a source voltage of the source follower transistor. The CMOS active pixel sensor array may further include a select transistor gate control line that is extended at about 90 degrees with respect to the first direction on the plane.

In an exemplary embodiment of the present invention, a 4-transistor CMOS sensor array having a 4-pixel shared structure includes a plurality of unit blocks arranged in a first direction on a plane. The unit block includes four photo diode regions arranged in the first direction on the plane; four transfer transistors respectively corresponding to the photo diode regions, wherein each of the transfer transistors is formed at a corner of the corresponding photo diode region; a first floating diffusion node shared by the first and second transfer transistors as a drain region; a second floating diffusion node shared by the third and fourth transfer transistors as a drain region; a first metal line for coupling the first and second floating diffusion nodes; a source follower transistor disposed between the third and fourth photo diode regions; a second metal line coupling the second floating diffusion node and a gate of the source follower transistor; a select transistor configured to output a source voltage of the source follower transistor and disposed between a first and second photo diode region; and a third metal line for coupling a source output of the source follower transistor to the select transistor.

In an exemplary embodiment of the present invention, a 4-transistor CMOS sensor array having a 4-pixel shared structure includes a plurality of unit blocks arranged in a first direction on a plane. The unit block includes four photo diode regions arranged in the first direction on the plane; four transfer transistors respectively corresponding to the photo diode regions, wherein each of the transfer transistors is formed at a corner of the corresponding photo diode region; a first floating diffusion node shared by the first and second transfer transistors as a drain region; a second floating diffusion node shared by the third and fourth transfer transistors as a drain region; a first metal line coupling the first and second floating diffusion nodes; a source follower transistor disposed between the first and second photo diode regions; a second metal line coupling the first floating diffusion node and a gate of the source follower transistor; a select transistor configured to output a source voltage of the source follower transistor and disposed between a third and fourth photo diode region; and a third metal line coupling a source output of the source follower transistor to the select transistor.

In an exemplary embodiment of the present invention, a 3-transistor CMOS sensor array having a 2-pixel shared structure includes a plurality of unit blocks arranged in a first direction on a plane. The unit block includes two photo diode regions arranged in the first direction on the plane; two transfer transistors respectively corresponding to the photo diode regions, wherein each of the transfer transistors is formed at a corner of the corresponding photo diode region; a floating diffusion node shared by the two transfer transistors as a drain region; a first metal line coupling the first and second floating diffusion nodes; a source follower transistor located in a space between the two photo diode regions; a reset transistor disposed between the two photo diode regions, arranged next to the source follower transistor at about 90 degrees with respect to the first direction, and sharing a drain with the source follower transistor; and a metal line coupling the floating diffusion node and a gate of the source follower transistor, wherein a variable voltage is applied to the shared drain of the reset transistor and the source follower transistor.

The 3-transistor CMOS sensor array may further include a dynamic driving voltage source configured to selectively provide one of a first driving voltage or a second driving voltage to the shared drain of the reset transistor and the source follower transistor, wherein the first driving voltage is higher than the second driving voltage.

In an exemplary embodiment of the present invention, the dynamic driving voltage source provides the first driving voltage when a voltage of the floating diffusion node is reset and the voltage of the floating diffusion node is output, and the dynamic driving voltage source provides the second driving voltage except when a voltage of the floating diffusion node is reset and the voltage of the floating diffusion node is output.

BRIEF DESCRIPTION OF THE DRAWINGS

The present invention will become more apparent to those of ordinary skill in the art when descriptions of exemplary embodiments thereof are read with reference to the accompanying drawings, of which.

DETAILED DESCRIPTION OF THE EXEMPLARY EMBODIMENTS

Figure 1:
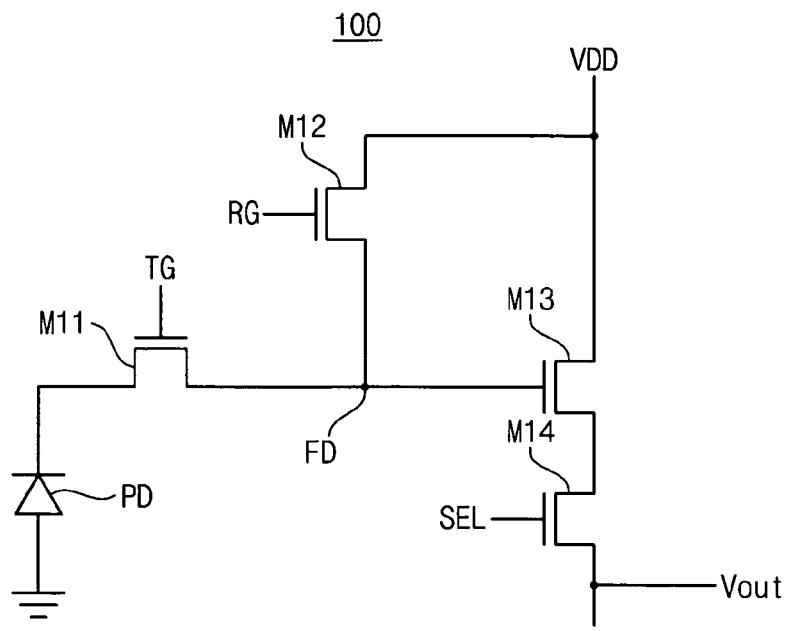
FIG. 1 is a circuit diagram illustrating a conventional 4-transistor complementary metal-oxide semiconductor (CMOS) active pixel sensor.

Hereinafter, the exemplary embodiments of the present invention will be described in detail with reference to the accompanying drawings. In the drawings, the size and relative sizes of layers and regions may be exaggerated for clarity. Like reference numerals refer to similar or identical elements throughout the description of the figures. As used herein, "natural numbers" are the numbers 1, 2, 3, . . . .

It will be understood that when an element or layer is referred to as being "on", "connected to" or "coupled to" another element or layer, it can be directly on, connected or coupled to the other element or layer or intervening elements or layers may be present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section.

It should be noted that in some alternative implementations, the functions/actions noted in the blocks may occur out of the order presented in the flowcharts. For example, two blocks shown in succession may be executed substantially concurrently or the blocks may sometimes be executed in the reverse order, depending upon the functionality/actions involved.

Figure 4:
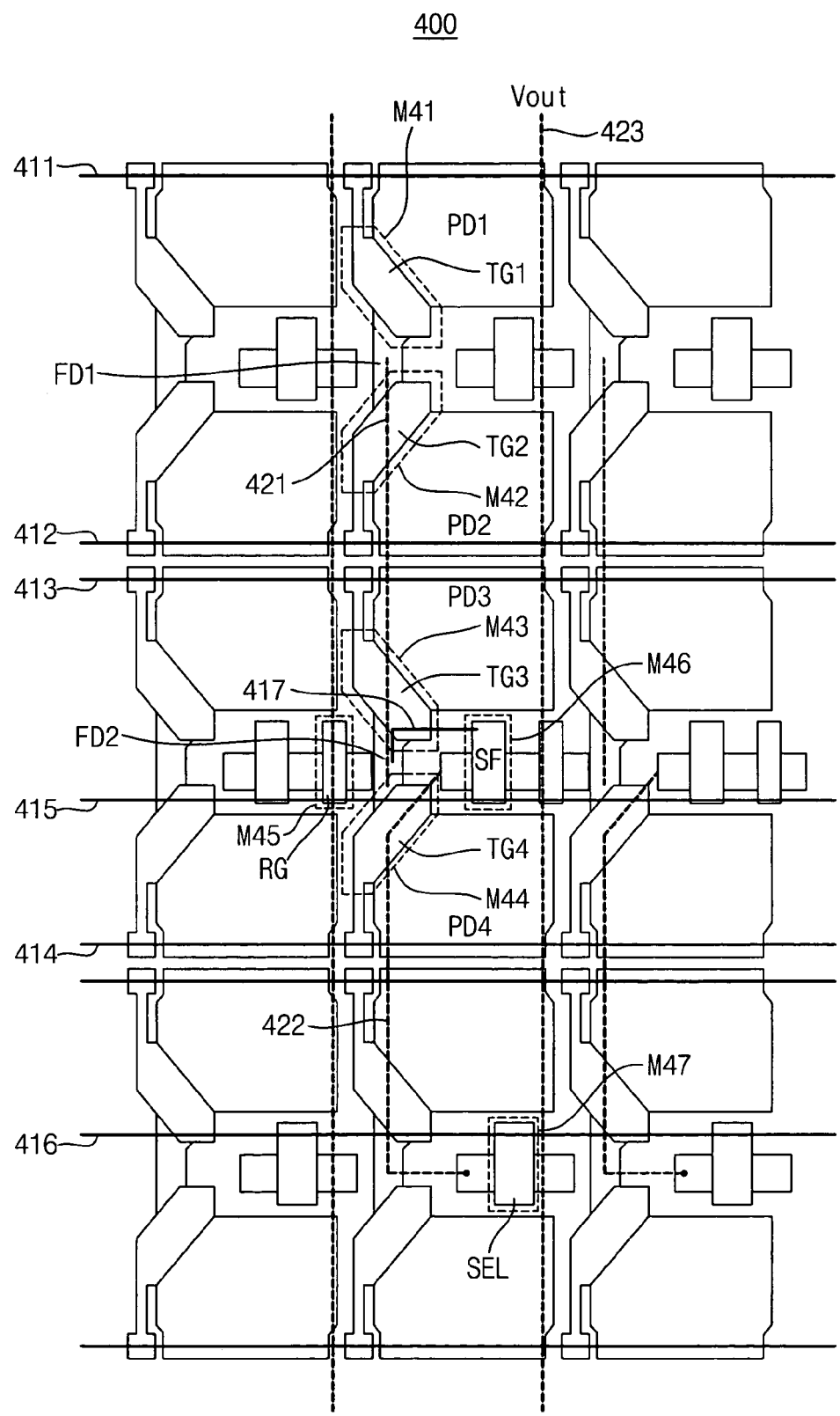
FIG. 4 is a top plan view illustrating a layout of a 4-transistor CMOS active pixel sensor array having a 4-pixel shared structure, according to an exemplary embodiment of the present invention.

FIG. 4 is a top plan view illustrating a layout of a 4-transistor complementary metal-oxide semiconductor (CMOS) active pixel sensor array having a 4-pixel shared structure, according to an exemplary embodiment of the present invention. Referring to FIG. 4, the layout 400 of a 4-transistor CMOS active pixel sensor is formed by arranging a plurality of unit blocks. A unit block includes four photo diode regions PD1, PD2, PD3 and PD4, and four transfer transistors M41, M42, M43 and M44. Each of the respective transfer transistors corresponds to one of the respective photo diode regions. Although not shown as such in FIG. 4, the unit blocks are repeatedly arranged in a first direction to form an entire active pixel array. In addition, the unit blocks may be further repeatedly arranged in a direction perpendicular to the first direction to form an entire active pixel sensor array.

In an exemplary embodiment of the present invention, four pixels share the reset transistor and the readout transistors, such as the select transistor and the source follower transistor in the shared structure shown in FIG. 4. It is contemplated that other shared structures of two pixels or more than four pixels may be formed. For example, a shared structure of two pixels and four pixels may be used to maintain optical symmetry and to secure a desired performance of the active pixel sensor or, for example, the present invention may be embodied as shared structures of six pixels or eight pixels.

For example, each unit block includes the four photo diode regions PD1, PD2, PD3 and PD4 arranged in the first direction, and the four transfer transistors M41, M42, M43 and M44 corresponding to the respective photo diode regions.

The two contiguous photo diode regions in the first direction form a pair. For example, the first photo diode region PD1 and the second photo diode region PD2 may form one pair, and the third photo diode region PD3 and the fourth photo diode region PD4 may form another pair, as shown in FIG. 4.

Each of the transfer transistors may be formed respectively at one corner of the corresponding photo diode region, and a gate region of the transfer transistor may be formed in an oblique direction with respect to the first direction. A channel width of the transfer transistor may be increased by such a formation in the oblique direction. Since the transfer transistor has a role of transmitting photoelectrons integrated during an integration period to a floating diffusion node, transmission efficiency may be enhanced when the wide channel width thereof is employed.

For example, the channel width may be increased when the gate region is formed at about a 45-degree direction with respect to the first direction.

The first floating diffusion node FD1 is shared between the first transfer transistor M41 corresponding to the first photo diode region PD1 and the second transfer transistor M42 corresponding to the photo diode region PD2, as shown in FIG. 4. In addition, the second floating diffusion node FD2 is shared between the third transfer transistor M43 corresponding to the third photo diode region PD3 and the fourth transfer transistor M44 corresponding to the photo diode region PD4.

The first floating diffusion node FD1 that is shared between the first transfer transistor M41 and the second transfer transistor M42, and the second floating diffusion node FD2 that is shared between the third transfer transistor M43 and the fourth transfer transistor M44, are coupled through a metal line 421. Therefore, the first floating diffusion node FD1 and the second floating diffusion node FD2 have a common electric potential.

A reset transistor for resetting an electric potential of the floating diffusion nodes FD1 and FD2, and a readout circuit including one or more transistors may be appropriately arranged in the spaces between the photo diode regions so as to maintain the optical symmetry of the structure. For example, the shared reset transistor and the readout transistors may be arranged in the space between the two photo diode regions, or may be distributed in the spaces between the photo diode regions within the corresponding unit block and the contiguous unit block. Such a distributed arrangement may enhance the fill factor and may maintain the optical symmetry of the structure.

The reset transistor M45 for resetting the second floating diffusion node FD2 to a driving voltage may be disposed, for example, in the space between the third photo diode region PD3 and the fourth photo diode region PD4. The reset transistor M45, by resetting the second floating diffusion node FD2 to the driving voltage, may simultaneously reset the first floating diffusion node FD1 having the common electric potential with the second floating diffusion node FD2.

The source follower transistor M46 may be arranged in the space between the third photo diode region PD3 and the fourth photo diode region PD4. As shown in FIG. 4, the second floating diffusion node FD2 and a gate SF of the source follower transistor M46 are coupled through the metal line 417. The electric potential of the first floating diffusion node FD1 and the second floating diffusion node FD2 is applied to the gate SF of the source follower transistor M46.

The select transistor M47 for transferring the source voltage of the source follower transistor M46 to an internal circuit (not shown) may be arranged in the space between a first photo diode region and a second photo diode region of a unit block which is contiguous to the fourth photo diode region PD4 in the first direction. The internal circuit (not shown) may be a circuit for processing output signals of the active pixel sensor.

In addition, the source follower transistor M46 and select transistor M47 are coupled in serial through a metal line 422. The source voltage of the source follower transistor M46 is output to the internal circuit through the select transistor M47 and an output signal (Vout) line 423.

The metal line 421 for coupling the first floating diffusion node FD1 and the second floating diffusion node FD2, the metal line 422 for coupling the source follower transistor M46 and the select transistor M47, and the Vout line 423 may be extended in the first direction.

Transfer transistor gate control lines for controlling voltages of gates TG1, TG2, TG3 and TG4 of the transfer transistors M41, M42, M43 and M44, to transfer photoelectrons integrated in the corresponding photo diode regions, may comprise an electrically conductive material. For example, the electrically conducting material could be a metal. In the same way, reset transistor gate control lines for controlling a voltage of the gate RG of the reset transistor M45 to reset the voltage of the floating diffusion nodes to the driving voltage, and select transistor gate control lines for controlling a voltage of the gate SEL of the select transistor M47, to output the source voltage of the select transistor M47 to the internal circuit, may comprise an electrically conductive material. Any electrically conducting materials may be utilized. Hereinafter, in the interests, of clarity and brevity, the electrically conducting lines will be referred to as metal lines.

The transfer transistor gate control lines 411, 412, 413 and 414 for controlling the voltages of the gates TG1, TG2, TG3 and TG4 of the four transfer transistors M41, M42, M43 and M44 to transfer the photoelectrons integrated in the corresponding photo diode regions PD1, PD2, PD3 and PD4 to the floating diffusion nodes FD1 and FD2 may be extended in a second direction. The second direction may be perpendicular to the first direction.

In addition, the reset transistor gate control line 415 for controlling the voltage of the gate RG of the reset transistor M45 to reset the voltage of the floating diffusion nodes to the driving voltage may be extended in the second direction. The select transistor gate control line 416 for controlling the voltage of the gate SEL of the select transistor M47 to output the source voltage of the select transistor M47 to the internal circuit may also be extended in the second direction.

It is preferable that the metal lines are not disposed over the photo diode regions so that shielding of the photo diode regions due to the metal lines may be reduced. For example, by arranging the metal lines outside of the upper portions of the photo diode regions that are exposed to incident light, the portion of the photo diode region exposed to the light may be increased. Although a portion of the metal lines may pass the upper portions of the photo diode regions, it is preferable that the metal lines pass corners of the photo diode regions, and shield the same area and symmetrically corresponding positions of the respective photo diode regions.

The metal lines 411 through 417 may be formed by a first metal layer deposition process, whereas the metal lines 421, 422 and 423 may be formed by a second metal layer deposition process. It is to be understood that the metal lines may be formed by various processes including, but not limited to, the processes described above.

Figure 3:
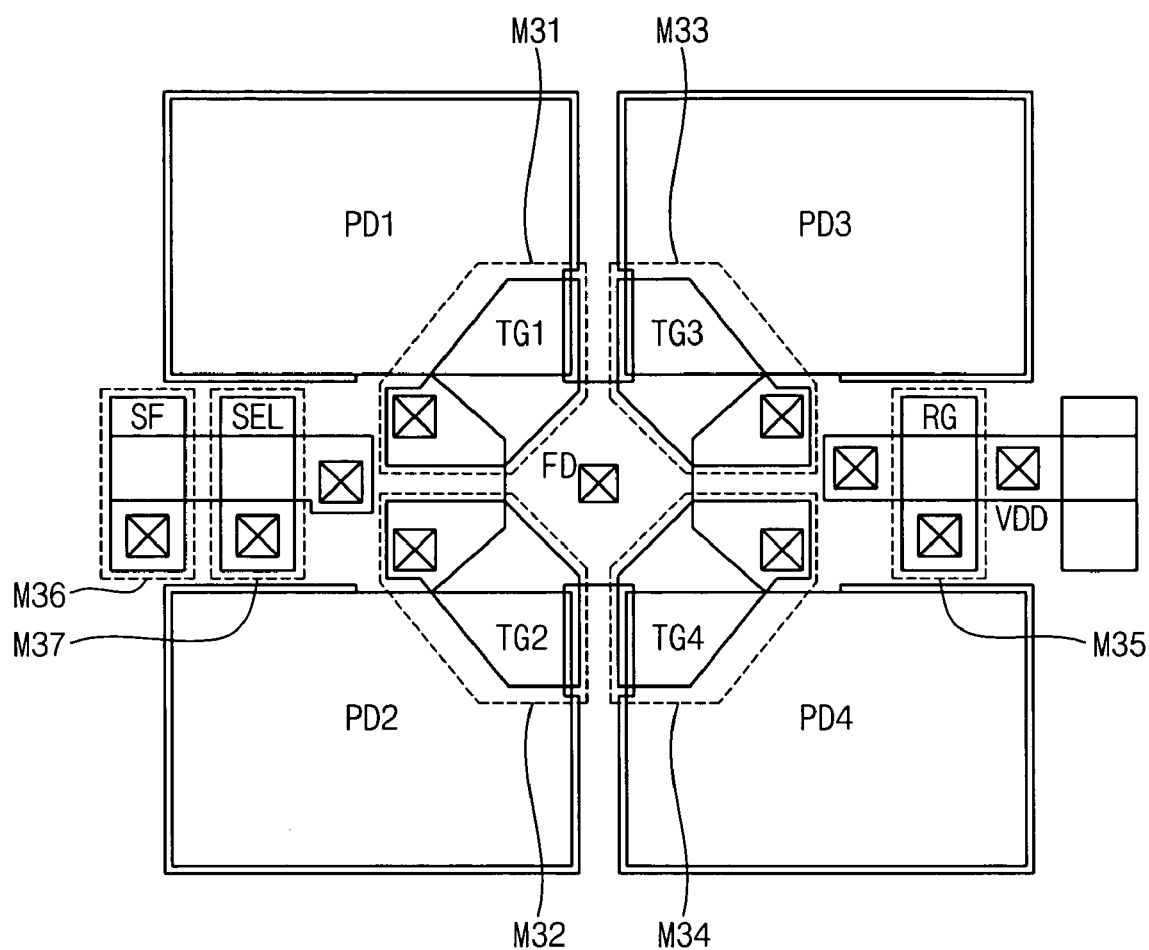
FIG. 3 is a top plan view illustrating a conventional layout of a 4-transistor CMOS active pixel sensor array having a 4-pixel shared structure.

Hereinafter, certain characteristics of the active pixel sensor array having the shared structure, according to exemplary embodiments of the present invention, will be described with reference to FIGS. 3 and 4.

First, a photoelectron transfer efficiency may be enhanced by forming the gate region of the transfer transistor for transferring the photoelectrons integrated in the respective photo diode regions in the oblique direction, for example, because a channel width of the transfer transistor may be increased within the limited layout.

Second, the shielding of the photo diode region due to the metal lines may be decreased by separating the metal line 421 for coupling the first floating diffusion node and the second floating diffusion node and the metal line 422 for coupling the source voltage of the source follower transistor and the select transistor.

Third, a reduction of conversion gain may be prevented by shortening the metal line 417 for coupling the floating diffusion node and the gate of the source follower transistor.

Fourth, an optical symmetry of the structure may be maintained to some extent by separating active regions of the source follower transistor and the select transistor. In the conventional layout of the active pixel sensor array having a shared structure, as shown in FIG. 3, the source follower transistor and the select transistor are contiguously located. In the active pixel sensor array having a shared structure, according to the exemplary embodiment of the present invention shown in FIG. 4, however, the source follower transistor and the select transistor are separately located. Therefore, the fill factor may be enhanced while maintaining the optical symmetry of the structure.

The top plan view of the layout of the 4-transistor CMOS active pixel sensor array having a 4-pixel shared structure, as shown in FIG. 4, illustrates an exemplary embodiment of the present invention. It is contemplated that the 4-transistor CMOS active pixel sensor array having a 4-pixel shared structure may be embodied in various configurations. For example, the source follower transistor and the reset transistor may be arranged between the first photo diode region and the second photo diode region, and the select transistor may be arranged between the third photo diode region and the fourth photo diode region.

Figure 5:
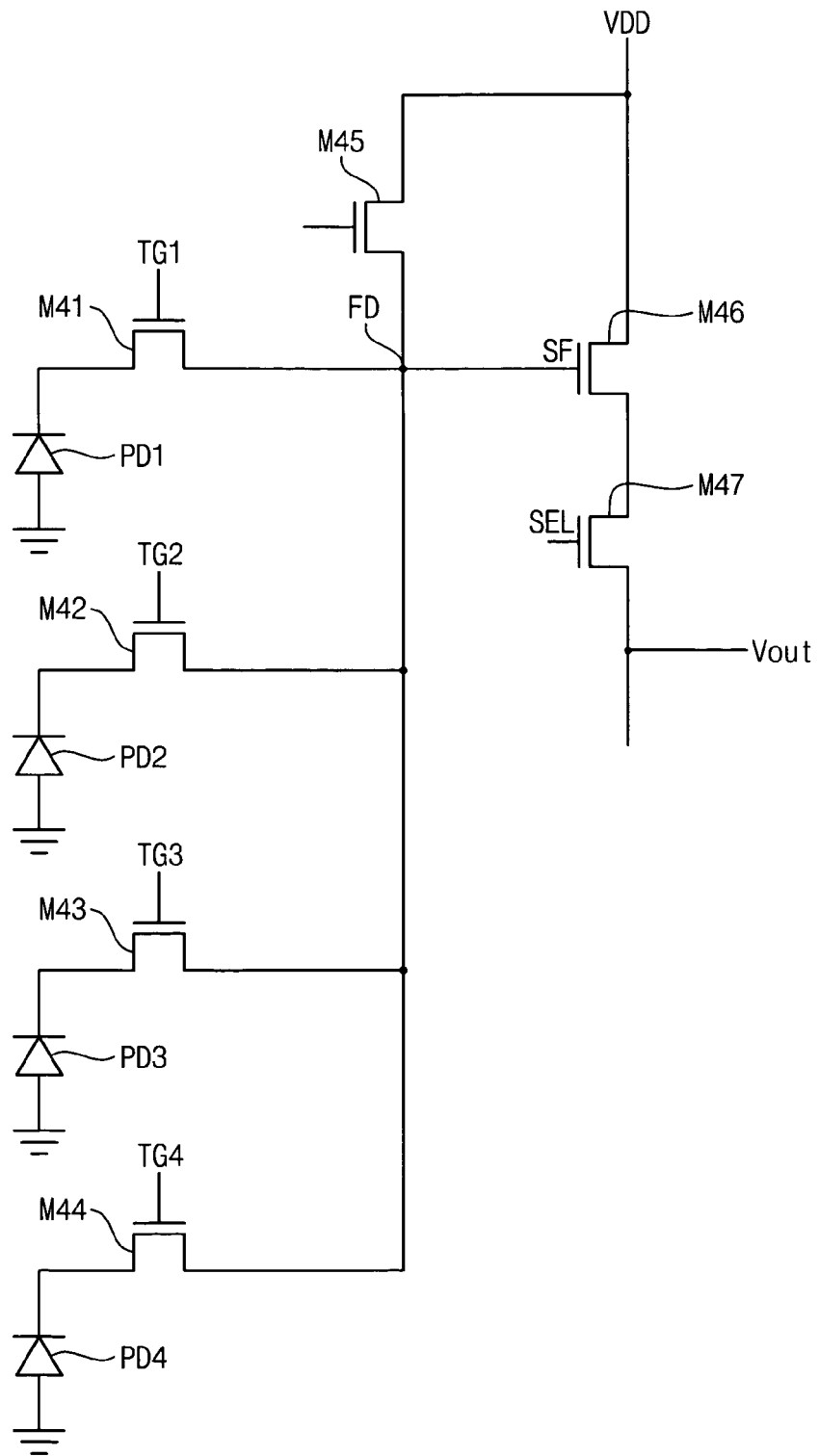
FIG. 5 is a circuit diagram illustrating a 4-transistor CMOS active pixel sensor having a 4-pixel shared structure, according to an exemplary embodiment of the present invention.

FIG. 5 is a circuit diagram illustrating a 4-transistor CMOS active pixel sensor array having a 4-pixel shared structure, according to an exemplary embodiment of the present invention.

The circuit diagram of FIG. 5 corresponds to a unit block of the layout of the 4-transistor CMOS active pixel sensor array having a 4-pixel shared structure of FIG. 4. Like reference numerals refer to similar or identical components in FIG. 5 and FIG. 4.

Referring to FIG. 5, the 4-transistor CMOS active pixel sensor array having a 4-pixel shared structure includes four photo diode regions PD1, PD2, PD3 and PD4, and four transfer transistors M41, M42, M43 and M44. Each of the respective transfer transistors corresponds to one of the respective photo diode regions. In an exemplary embodiment of the present invention, four photo diode regions PD1, PD2, PD3 and PD4, and the four transfer transistors M41, M42, M43 and M44 share a reset transistor M45, a source follower transistor M46 and a select transistor M47.

The photo diode regions PD1, PD2, PD3 and PD4 and the transfer transistors M41, M42, M43 and M44 included in the active pixel sensor array of FIG. 5 share the reset transistor M45 and the source follower transistor M46, in contrast to with the active pixel sensor 100 of FIG. 1. In addition, one floating diffusion node FD is shared.

In the top plan view illustrating the layout of a 4-transistor CMOS active pixel sensor array having a 4-pixel shared structure of FIG. 4, the first floating diffusion node FD1 and the second floating diffusion node FD2 are shown as separated. However, since the first floating diffusion node FD1 and the second floating diffusion node FD2 are coupled through the metal line 421 and have a common electric potential, the two nodes are represented as one floating diffusion node FD in the circuit diagram of FIG. 5.

Operations of the active pixel sensor array having a shared structure of FIG. 5 may be described, in the interests of clarity and simplicity, by applying the operations of the 4-transistor active pixel sensor to the shared structure. For example, the reset transistor M45 resets the voltage of the floating diffusion node FD to the driving voltage VDD, and the photoelectrons integrated in the first photo diode PD1, which corresponds to the first transfer transistor M41, are transferred to the floating diffusion node FD by turning on the first transfer transistor M41. The source follower transistor M46 samples the voltage of the floating diffusion node FD. Finally, the select transistor M47 is turned on to output the source voltage of the source follower transistor M46 to the internal circuit.

The above-described operations are likewise performed for the second photo diode region PD2 and the second transfer transistor M42, the third photo diode region PD3 and the third transfer transistor M43, and the fourth photo diode region PD4 and the fourth transfer transistor M44.

Figure 6:
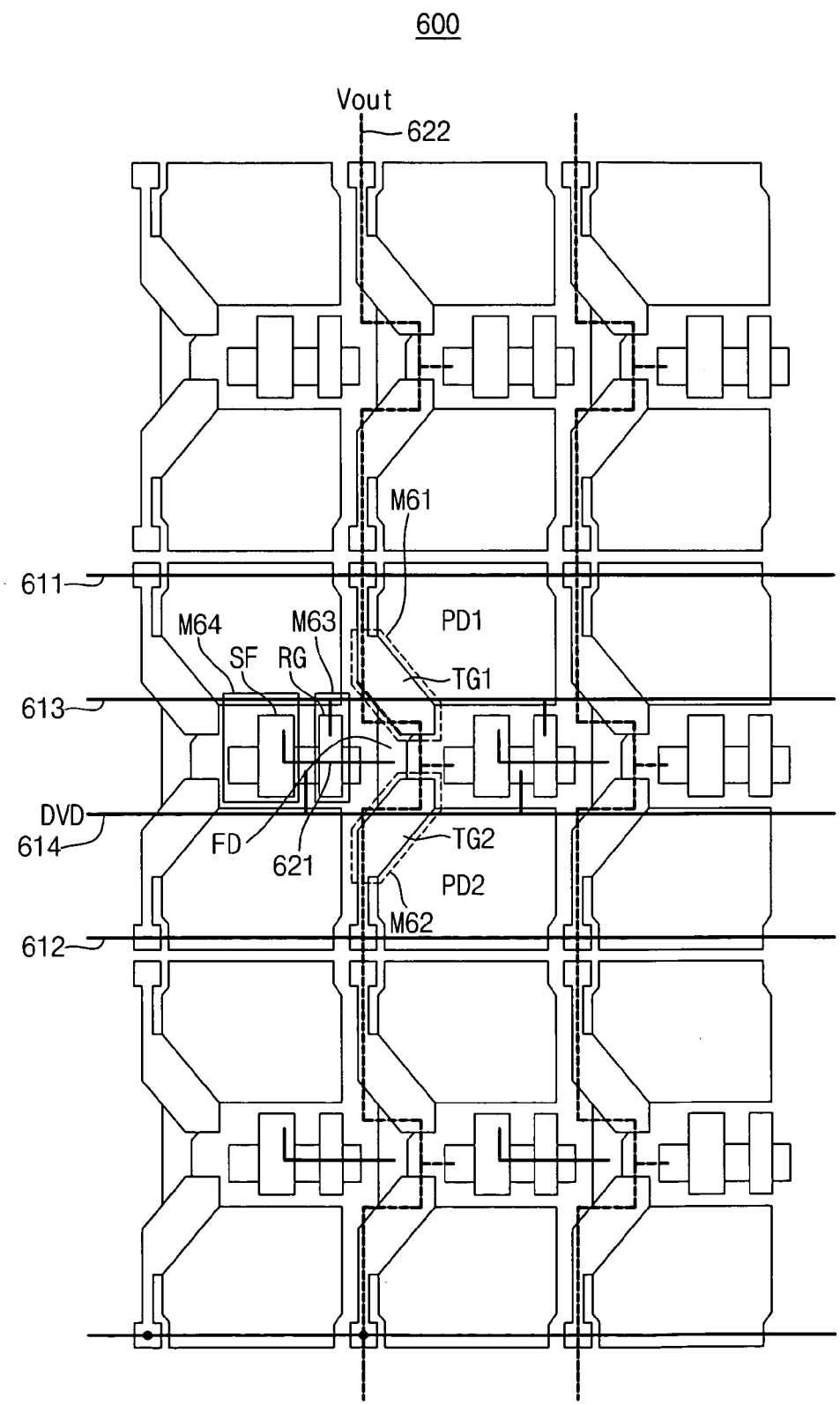
FIG. 6 is a top plan view illustrating a layout of a 3-transistor CMOS active pixel sensor array having a 2-pixel shared structure, according to an exemplary embodiment of the present invention.

FIG. 6 is a top plan view illustrating a layout of a 3-transistor CMOS active pixel sensor array having a 2-pixel shared structure, according to an exemplary embodiment of the present invention.

The layout 600 of the 3-transistor CMOS active pixel sensor array having a 2-pixel shared structure is formed as a shared structure from the conventional 3-transistor active pixel sensor 200. That is, according to the structure of FIG. 6, the select transistor is excluded, in contrast to the conventional 4-transistor active pixel sensor 100 of FIG. 1. The function of the select transistor M13 of the conventional 4-transistor active pixel sensor 100 of FIG. 1 is substituted using a dynamic driving voltage DVD of FIG. 6.

Referring to FIG. 6, the layout 600 of the 3-transistor CMOS active pixel sensor array is formed by arranging a plurality of unit blocks. A unit block includes two photo diode regions PD1 and PD2 arranged in a first direction, and two transfer transistors M61 and M62 respectively corresponding to the photo diode regions. The unit blocks are repeatedly arranged in the first direction to form an entire active pixel array. In addition, the unit blocks may be further repeatedly arranged in a direction perpendicular to the first direction to form an entire active pixel sensor array.

Each unit block includes the two photo diode regions PD1 and PD2 arranged in the first direction, and the four transfer transistors M41 and M42 corresponding to the respective photo diode regions. Each unit block further includes a reset transistor M63 and a source follower transistor M64 arranged in a space between the photo diode regions.

Each of the transfer transistors may be formed at one corner of the corresponding photo diode region, and a gate region of the transfer transistor may be formed in an oblique direction with respect to the first direction. A channel width of the transfer transistor may be increased by forming the gate region of the transfer transistor at about a 45-degree direction with respect to the first direction. An effect of forming the gate region in the oblique direction may be described with reference to the 4-transistor active pixel sensor array having the 4-pixel shared structure shown in FIG. 4.

The floating diffusion node FD is shared between the first transfer transistor M61 corresponding to the first photo diode region PD1 and the second transfer transistor M62 corresponding to the photo diode region PD2.

The source follower transistor M64 may be placed in a space between the first photo diode region PD1 and the second photo diode region PD2. The floating diffusion node FD and a gate SF of the source follower transistor M64 are coupled through a metal line 621.

In addition, the reset transistor M63 may be placed in the space between the first photo diode region PD1 and the second photo diode region PD2. The reset transistor M63 performs a function of resetting a voltage of the floating diffusion node FD to a driving voltage.

Transfer transistor gate control lines for controlling voltages of gates TG1 and TG2 of the transfer transistor M61 and M62, to transfer photoelectrons integrated in the corresponding photo diode regions PD1 and PD2, may comprise an electrically conductive material. For example, the electrically conducting material could be a metal. In the same way, reset transistor gate control lines for controlling a voltage of a gate RG of the reset transistor M63, to reset the voltage of the floating diffusion node FD to the driving voltage, may be formed with metal.

The transfer transistor gate control lines 611 and 612 for controlling the voltages of the gates TG1 and TG2 of the two transfer transistors M61 and M62 to transfer the photoelectrons integrated in the corresponding photo diode regions PD1 and PD2 to the floating diffusion node FD may be extended in a second direction. Preferably, the second direction may be perpendicular to the first direction as in the case of the 4-transistor active pixel sensor array having the 4-pixel shared structure shown in FIG. 4.

In addition, the reset transistor gate control line 613 for controlling the voltage of the gate RG of the reset transistor M63 to reset the voltage of the floating diffusion node to the driving voltage may be extended in the second direction. A dynamic driving voltage line 614 for substituting a select transistor by providing a dynamic driving voltage DVD to the source follower transistor and reset transistor may be lengthened in the second direction.

It is preferable that the metal lines are not disposed over the photo diode regions so that shielding of the photo diode regions due to the metal lines may be reduced. For example, by arranging the metal lines outside of the upper portions of the photo diode regions that are exposed to incident light, the portion of the photo diode region exposed to the light may be increased. Although a portion of the metal lines may pass the upper portions of the photo diode regions, it is preferable that the metal lines pass corners of the photo diode regions, and shield the same area and symmetrically corresponding position of the respective photo diode regions.

Figure 7:
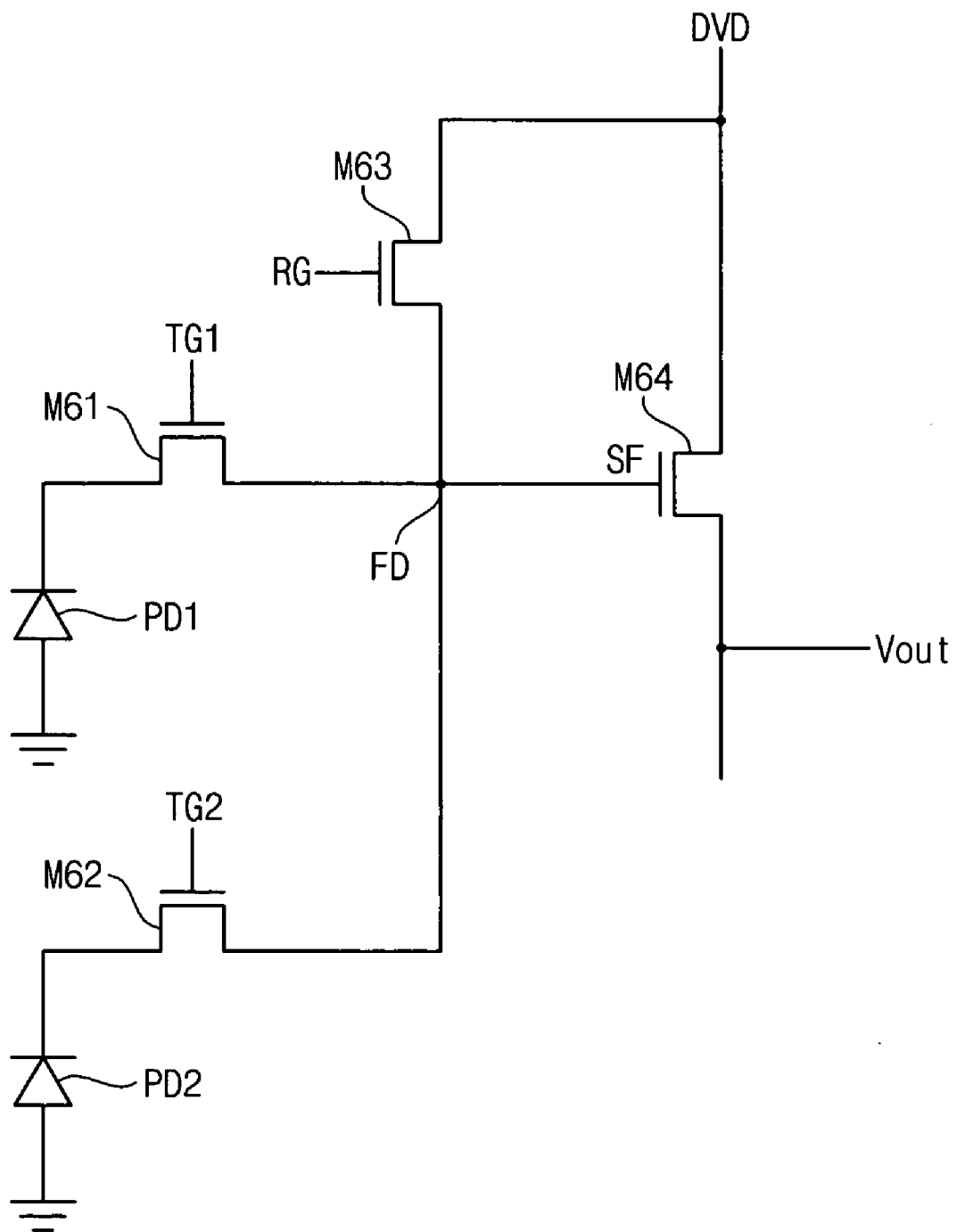
FIG. 7 is a circuit diagram illustrating a 3-transistor CMOS active pixel sensor having a 2-pixel shared structure, according to an exemplary embodiment of the present invention.

FIG. 7 is a circuit diagram illustrating a 3-transistor CMOS active pixel sensor having a 2-pixel shared structure, according to an exemplary embodiment of the present invention.

The circuit diagram of FIG. 7 corresponds to a unit block of the 3-transistor CMOS active pixel sensor array having a 2-pixel shared structure of FIG. 6. Like reference numerals refer to similar or identical components in FIG. 7 and FIG. 6.

Figure 2:
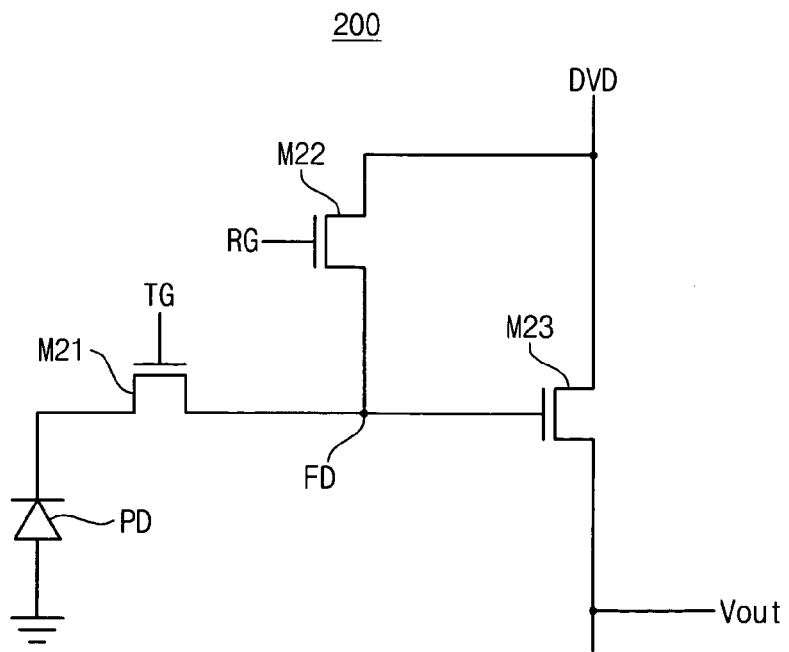
FIG. 2 is a circuit diagram illustrating a conventional 3-transistor CMOS active pixel sensor.

Referring to FIG. 7, the 3-transistor CMOS active pixel sensor array having a 2-pixel shared structure includes two photo diode regions PD1 and PD2, and two transfer transistors M61 and M62. Each of the respective transfer transistors corresponds to one of the respective photo diode regions. The two photo diode regions PD1 and PD2, and the two transfer transistors M61 and M42 share the reset transistor M63 and the source follower transistor M64. For example, the active pixel sensor array of FIG. 7 is formed so that the conventional 3-transistor active pixel sensor 200 of FIG. 2 may have a shared structure.

Operations of the active pixel sensor array having a shared structure of FIG. 7 may be described, in the interests of clarity and simplicity, by applying the operations of the 3-transistor active pixel sensor to the shared structure. For example, the reset transistor M63 resets the voltage of the floating diffusion node FD to a high driving voltage when the dynamic driving voltage is increased to the high driving voltage. The photoelectrons integrated in the first photo diode PD1, which corresponds to the first transfer transistor M61, are transferred to the floating diffusion node FD by turning on the first transfer transistor M61 while the dynamic driving voltage is decreased to a low driving voltage. Finally, the source follower transistor M64 samples the voltage of the floating diffusion node FD and outputs the output signal Vout to the internal circuit while the dynamic driving voltage is increased to the high driving voltage.

The above-described operations are likewise performed for the second photo diode PD2 and the second transfer transistor M62.

As a modification of the layout 400 of the 4-transistor active pixel sensor array having the 4-pixel shared structure shown in FIG. 4, in another embodiment of the 4-transistor active pixel sensor array having the 4-pixel shared structure the positions of the select transistor and the source follower transistor may be changed by altering a configuration of the metal line. For example, in the 4-transistor active pixel sensor array of FIG. 5, the select transistor M47 may be coupled between the source follower transistor M46 and the driving voltage VDD.

The above-described and other configurations may be employed for an efficiency of a metal line or for a reduction of noise of components by increasing a channel length of a transistor.

Figure 8:
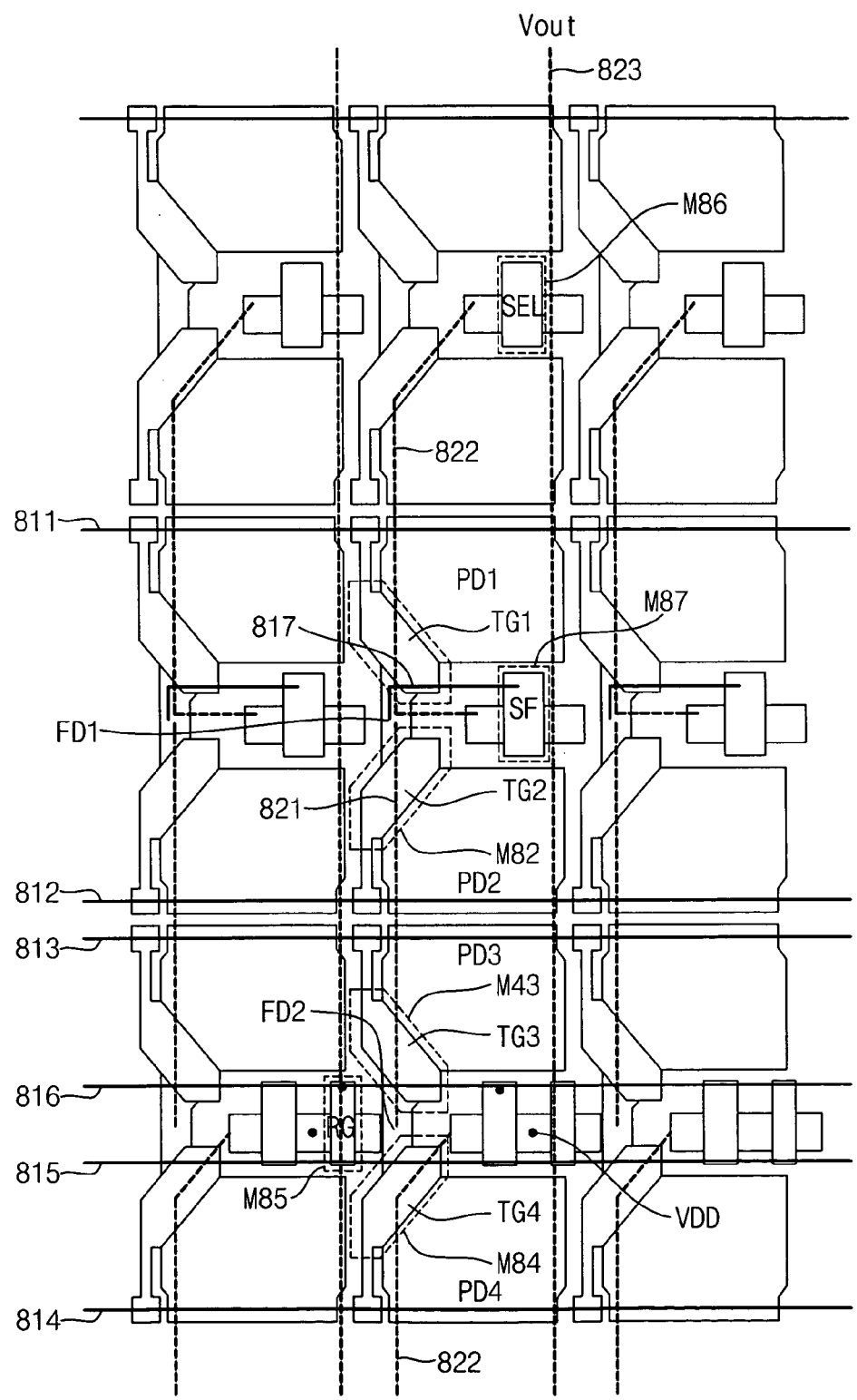
FIG. 8 is a top plan view illustrating a layout of a 4-transistor CMOS active pixel sensor array having a 4-pixel shared structure, according to an exemplary embodiment of the present invention.

FIG. 8 is a top plan view illustrating a layout of a 4-transistor CMOS active pixel sensor array having a 4-pixel shared structure, according to an exemplary embodiment of the present invention.

Referring to FIG. 8, photo diode regions PD1, PD2, PD3 and PD4, transfer transistors M81, M82, M83 and M84, a first floating diffusion node FD1 and a second floating diffusion node FD2 may be formed in the same way as in the layout 400 of the 4-transistor active pixel sensor array having the 4-pixel shared structure shown in FIG. 4.

In addition, the first floating diffusion node FD1 and the second floating diffusion node FD2 are coupled through a metal line 821 to have a common electric potential, for example, in the same way as in the layout 400 of the 4-transistor active pixel sensor array having the 4-pixel shared structure shown in FIG. 4.

A reset transistor M85 for resetting the floating diffusion nodes FD1 and FD2 is arranged in a space between the third photo diode region PD3 and the fourth photo diode region PD4, for example, as in the layout 400 of the 4-transistor active pixel sensor array having the 4-pixel shared structure shown in FIG. 4.

The reset transistor M85, by resetting the second floating diffusion node FD2 to the driving voltage, may reset the first floating diffusion node FD1 having the common electric potential with the second floating diffusion node FD2.

The source follower transistor M87 may be arranged in the space between the first photo diode region PD1 and the second photo diode region PD2. Unlike the layout 400 of the 4-transistor active pixel sensor array having the 4-pixel shared structure shown in FIG. 4, the source follower transistor M87 may be arranged in the space between the first photo diode region PD1 and the second photo diode region PD2 instead of the space between the third photo diode region PD3 and the fourth photo diode region PD4.

The first floating diffusion node FD1 and a gate SF of the source follower transistor M87 are coupled through the metal line 817. Therefore, the electric potential of the first floating diffusion node FD1 and the second floating diffusion node FD2 is applied to the gate SF of the source follower transistor M87.

The select transistor M86 for transferring the source voltage of the source follower transistor M87 to an internal circuit (not shown) may be arranged in a space between a third photo diode region and a fourth photo diode region of a unit block, which is contiguous to the first photo diode region PD1 in the first direction. The internal circuit (not shown) may be a circuit for processing output signals of the active pixel sensors.

In addition, the source follower transistor M87 and the select transistor M86 are coupled in serial through a metal line 822. The source voltage of the source follower transistor M87 is output to the internal circuit through an output signal (Vout) line 823.

The metal line 821 for coupling the first floating diffusion node FD1 and the second floating diffusion node FD2, the metal line 822 for coupling the select transistor M86 and the source follower transistor M87, and the Vout line 823 may be extended in the first direction.

Transfer transistor gate control lines for controlling voltages of gates TG1, TG2, TG3 and TG4 of the transfer transistors M81, M82, M83 and M84, to transfer photoelectrons integrated in the corresponding photo diode regions, may comprise an electrically conductive material. For example, the electrically conducting material could be a metal. In the same way, reset transistor gate control lines for controlling a voltage of a gate RG of the reset transistor M85 to reset the voltage of the floating diffusion node FD to the driving voltage and select transistor gate control lines for controlling a voltage of the gate SEL of the select transistor M86, to output the source voltage of the select transistor M87 to the internal circuit, may be formed with metal.

The transfer transistor gate control lines 811, 812, 813 and 814 for controlling the voltages of the gates TG1, TG2, TG3 and TG4 of the four transfer transistors M81, M82, M83 and M84 to transfer the photoelectrons integrated in the corresponding photo diode regions PD1, PD2, PD3 and PD4 to the floating diffusion nodes FD1 and FD2 may be extended in a second direction. The second direction may be perpendicular to the first direction.

In addition, the reset transistor gate control line 815 for controlling the voltage of the gate RG of the reset transistor M85 to reset the voltage of the floating diffusion nodes to the driving voltage may be extended in the second direction. The select transistor gate control line 816 for controlling the voltage of the gate SEL of the select transistor M86 to output the source voltage of the select transistor M87 to the internal circuit may also be extended in the second direction.

The metal lines 811, 812, 813, 814, 815, 816 and 817 may be formed by a first metal layer deposition process, while the metal lines 821, 822 and 823 may be formed by a second metal layer deposition process. It is to be understood that the metal lines may be formed variously using other processes.

Figure 9:
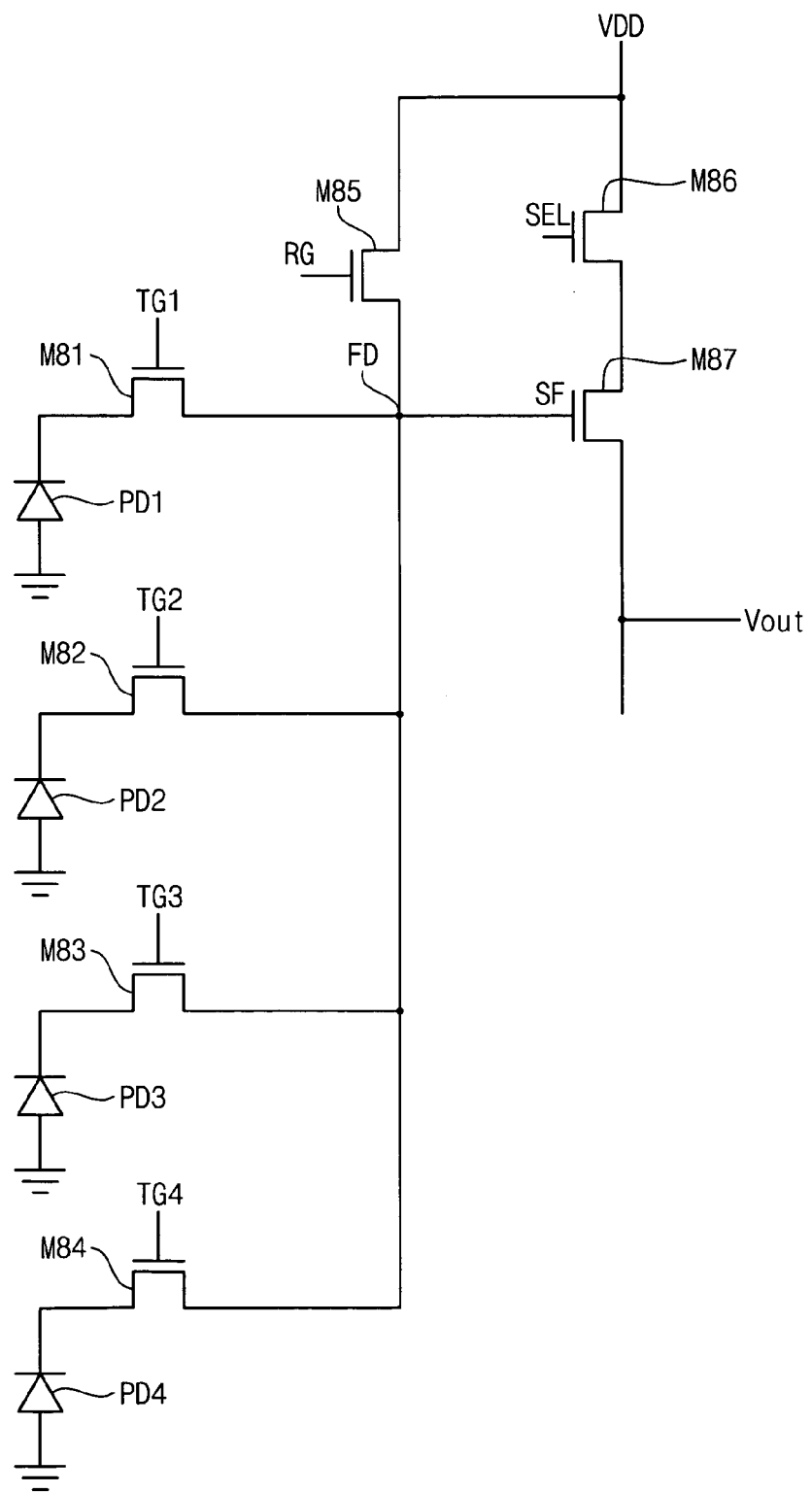
FIG. 9 is a circuit diagram illustrating a 4-transistor CMOS active pixel sensor having a 4-pixel shared structure, according to an exemplary embodiment of the present invention.

FIG. 9 is a circuit diagram illustrating a 4-transistor CMOS active pixel sensor array having a 4-pixel shared structure, according to an exemplary embodiment of the present invention.

The circuit diagram of FIG. 9 corresponds to a unit block of the layout of the 4-transistor active pixel sensor array having the 4-pixel shared structure of FIG. 8. Like reference numerals refer to similar or identical components in FIG. 9 and FIG. 8.

Referring to FIG. 9, the 4-transistor CMOS active pixel sensor array having the 4-pixel shared structure includes four photo diode regions PD1, PD2, PD3 and PD4, and four transfer transistors M81, M82, M83 and M84. Each of the respective transfer transistors corresponds to one of the respective photo diode regions. In an exemplary embodiment of the present invention, the four photo diode regions PD1, PD2, PD3 and PD4, and the four transfer transistors M81, M82, M83 and M84 share a reset transistor M85, a select transistor M86 and a source follower transistor M87. In the top plan view illustrating the 4-transistor active pixel sensor array having the 4-pixel shared structure of FIG. 8, the first floating diffusion node FD1 and the second floating diffusion node FD2 are shown separately. However, since the first floating diffusion node FD1 and the second floating diffusion node FD2 are coupled through the metal line 821 and have a common electric potential, the two nodes are represented as one floating diffusion node FD in the circuit diagram of FIG. 9.

Unlike the 4-transistor active pixel sensor array having the 4-pixel shared structure of FIG. 5, the select transistor M86 is arranged between the driving voltage and the source follower transistor M87 in FIG. 9. The operations of the array of FIG. 9, however, are similar or identical with the operations of the array shown in FIG. 5

For example, the reset transistor M85 resets the voltage of the floating diffusion node FD to the driving voltage VDD. The photoelectrons integrated in the first photo diode PD1, which corresponds to the first transfer transistor M81, are transferred to the floating diffusion node FD by turning on the first transfer transistor M81. The select transistor M86 is turned on to couple the drain of the source follower transistor M87 to the driving voltage, and the source follower transistor M87 samples the voltage of the floating diffusion node FD to output the source voltage of the source follower transistor M87 to the internal circuit.

The above-described operations are likewise performed for the second photo diode region PD2 and the second transfer transistor M82, the third photo diode region PD3 and the third transfer transistor M83, and the fourth photo diode region PD4 and the fourth transfer transistor M84.

Exemplary embodiments of the present invention may provide an active pixel sensor array having a shared structure that maintains an optical symmetry of the structure and simultaneously enhances availability and productivity of a manufacturing process. The active pixel sensor array having a shared structure, according to the exemplary embodiments of the present invention, may increase a fill factor.

Although the exemplary embodiments of the present invention have been described with reference to the accompanying drawings for the purpose of illustration, it is to be understood that the inventive processes and apparatus are not to be construed as limited thereby. It will be readily apparent to those of ordinary skill in the art that various modifications to the foregoing exemplary embodiments may be made without materially departing from the scope of the invention as defined by the appended claims, with equivalents of the claims to be included therein.

What is claimed is:

1. A CMOS active pixel sensor array having a shared structure, comprising a plurality of unit blocks, the unit block comprising:

N pairs of photo diode regions arranged in a first direction on a plane, where N is a natural number;

2N transfer transistors respectively corresponding to the photo diode regions, wherein each of the transfer transistors is formed at a corner of the corresponding photo diode region, and wherein for each pair of photo diode regions the two corresponding transfer transistors symmetrically oppose each other;

N floating diffusion nodes, wherein each of the floating diffusion nodes is respectively arranged between a pair of photo diode regions, and wherein each of the floating diffusion nodes is shared by the two corresponding transfer transistors and the corresponding pair of photo diode regions;

at least one metal line coupling the N floating diffusion nodes;

a reset transistor configured to reset a voltage of the floating diffusion nodes; and a readout circuit including at least one transistor configured to sample the floating diffusion node, wherein the reset transistor and the at least one transistor of the readout circuit are disposed between two or more pairs of the N pairs of photo diode regions.

2. The CMOS active pixel sensor array of claim 1, wherein a gate region of the transfer transistor is formed in an oblique direction with respect to the first direction on the plane.

3. The CMOS active pixel sensor array of claim 2, wherein the oblique direction corresponds to about a 45-degree direction with respect to the first direction on the plane.

4. The CMOS active pixel sensor array of claim 1, further comprising transfer transistor gate control lines that are extended at about a 90-degree direction with respect to the first direction on the plane.

5. The CMOS active pixel sensor array of claim 1, further comprising reset transistor gate control lines that are extended at about a 90-degree direction with respect to the first direction on the plane.

6. The CMOS active pixel sensor array of claim 1, wherein the at least one metal line coupling the N floating diffusion nodes is extended in the first direction.

7. The CMOS active pixel sensor array of claim 1, wherein the readout circuit includes a source follower transistor, and wherein a voltage of the floating diffusion node is applied to a gate of the source follower transistor.

8. The CMOS active pixel sensor array of claim 7, wherein the readout circuit further includes a select transistor configured to output a source voltage of the source follower transistor.

9. The CMOS active pixel sensor array of claim 8, further comprising a select transistor gate control line that is extended at about 90 degrees with respect to the first direction on the plane.

10. A 4-transistor CMOS sensor array having a 4-pixel shared structure, comprising a plurality of unit blocks arranged in a first direction on a plane, the unit block comprising:

four photo diode regions arranged in the first direction on the plane;

four transfer transistors respectively corresponding to the photo diode regions, wherein each of the transfer transistors is formed at a corner of the corresponding photo diode region;

a first floating diffusion node shared by the first and second transfer transistors as a drain region;

a second floating diffusion node shared by the third and fourth transfer transistors as a drain region;

a first metal line coupling the first and second floating diffusion nodes;

a source follower transistor disposed between the third and fourth photo diode regions;

a second metal line coupling the second floating diffusion node and a gate of the source follower transistor;

a select transistor configured to output a source voltage of the source follower transistor and disposed between a first and second photo diode region; and a third metal line coupling a source output of the source follower transistor to the select transistor.

11. The 4-transistor CMOS sensor array of claim 10, wherein a gate region of the transfer transistor is formed in an oblique direction with respect to the first direction on the plane.

12. The 4-transistor CMOS sensor array of claim 11 wherein the oblique direction corresponds to about a 45-degree direction with respect to the first direction on the plane.

13. The 4-transistor CMOS sensor array of claim 10, further comprising transfer transistor gate control lines that are extended at about a 90-degree direction with respect to the first direction on the plane.

14. The 4-transistor CMOS sensor array of claim 10, further comprising a reset transistor gate control line that is extended at about a 90-degree direction with respect to the first direction on the plane.

15. The 4-transistor CMOS sensor array of claim 10, further comprising a select transistor gate control line that is extended at about 90 degrees with respect to the first direction on the plane.

16. The 4-transistor CMOS sensor array of claim 10, wherein the metal line coupling the first and the second floating diffusion nodes is extended in the first direction.

17. A 4-transistor CMOS sensor array having a 4-pixel shared structure, comprising a plurality of unit blocks arranged in a first direction on a plane, the unit block comprising:

four photo diode regions arranged in the first direction on the plane;

four transfer transistors respectively corresponding to the photo diode regions, wherein each of the transfer transistors is formed at a corner of the corresponding photo diode region;

a first floating diffusion node shared by the first and second transfer transistors as a drain region;

a second floating diffusion node shared by the third and fourth transfer transistors as a drain region;

a first metal line coupling the first and second floating diffusion nodes;

a source follower transistor disposed between the first and second photo diode regions;

a second metal line coupling the first floating diffusion node and a gate of the source follower transistor;

a select transistor configured to output a source voltage of the source follower transistor and disposed between a third and fourth photo diode region; and a third metal line coupling a source output of the source follower transistor to the select transistor.

18. The 4-transistor CMOS sensor array of claim 17, wherein a gate region of the transfer transistor is formed in an oblique direction with respect to the first direction on the plane.

19. The 4-transistor CMOS sensor array of claim 18, wherein the oblique direction corresponds to about a 45-degree direction with respect to the first direction on the plane.

20. The 4-transistor CMOS sensor array of claim 17, further comprising transfer transistor gate control lines that are extended at about a 90 degree direction with respect to the first direction on the plane.

21. The 4-transistor CMOS sensor array of claim 17, further comprising a reset transistor gate control line that is extended at about a 90-degree direction with respect to the first direction on the plane.

22. The 4-transistor CMOS sensor array of claim 17, further comprising a select transistor gate control line that is extended at about 90 degrees with respect to the first direction on the plane.

23. The 4-transistor CMOS sensor array of clam 17, wherein the metal line coupling the first and the second floating diffusion nodes is extended in the first direction.

24. A 3-transistor CMOS sensor array having a 2-pixel shared structure, comprising a plurality of unit blocks arranged in a first direction on a plane, the unit block comprising:
- two photo diode regions arranged in the first direction on the plane;
- two transfer transistors respectively corresponding to the photo diode regions, wherein each of the transfer transistors is formed at a corner of the corresponding photo diode region;
- a floating diffusion node shared by the two transfer transistors as a drain region;
- a source follower transistor located in a space between the two photo diode regions;
- a reset transistor disposed between the two photo diode regions, arranged next to the source follower transistor at about 90 degrees with respect to the first direction, and sharing a drain with the source follower transistor; and
- a metal line the coupling the floating diffusion node and a gate of the source follower transistor,
- wherein a variable voltage is applied to the shared drain of the reset transistor and the source follower transistor.

25. The 3-transistor CMOS sensor array of damn 24, wherein a gate region of the transfer transistor is formed in an oblique direction with respect to the first direction on the plane.

26. The 3-transistor CMOS sensor array of claim 25, wherein the oblique direction corresponds to about a 45-degree direction with respect to the first direction on the plane.

27. The 3-transistor CMOS sensor array of claim 24, further comprising transfer transistor gate control lines that are extended at about a 90-degree direction with respect to the first direction on the plane.

28. The 3-transistor CMOS sensor array of claim 24, further comprising a reset transistor gate control line that is extended at about a 90-degree direction with respect to the first direction on the plane.

29. The 3-transistor CMOS sensor array of claim 24, further comprising a select transistor gate control line that is extended at about 90 degrees with respect to the first direction on the plane.

30. The 3-transistor CMOS sensor array of claim 24, further comprising a dynamic driving voltage source configured to selectively provide one of a first driving voltage or a second driving voltage to the shared drain of the reset transistor and the source follower transistor, the first driving voltage being higher than the second driving voltage.

31. The 3-transistor CMOS sensor array of claim 30, wherein the dynamic driving voltage source provides the first driving voltage when a voltage of the floating diffusion node is reset and the voltage of the floating diffusion node is output, and wherein the dynamic driving voltage source provides the second driving voltage except when a voltage of the floating diffusion node is reset and the voltage of the floating diffusion node is output.

* * * * *